United States Patent [19]

Wahlquist

[11] Patent Number: 4,473,804

[45] Date of Patent: Sep. 25, 1984

[54] LINEAR CLASS B TRANSCONDUCTANCE POWER AMPLIFIER

[75] Inventor: Clayton C. Wahlquist, West Valley City, Utah

[73] Assignee: Tektronix, Inc., Beaverton, Oreg.

[21] Appl. No.: 351,580

[22] Filed: Feb. 23, 1982

[51] Int. Cl.³ .......................... H03F 3/45; H03F 3/26
[52] U.S. Cl. .................................. 330/255; 330/261; 330/273
[58] Field of Search ............... 330/262, 267, 252, 261, 330/273, 255

[56] References Cited

U.S. PATENT DOCUMENTS

| 3,437,945 | 4/1969 | Duncan | 330/267 |
| 3,638,130 | 1/1972 | Freeborn | 330/260 |
| 3,768,031 | 10/1973 | Ring | 330/262 |

Primary Examiner—James B. Mullins
Assistant Examiner—G. Wan
Attorney, Agent, or Firm—John D. Winkelman; John Smith-Hill

[57] ABSTRACT

This application discloses a linear class B transconductance power amplifier suited for use in driving an inductive load, such as a convergence control coil for a color television receiver or video monitor. A preferred form of the amplifier includes a first pair of transistors having their emitters connected together and to a reference potential, their collectors being connected together and to a voltage source; and a second pair of transistors connected to the bases of the first pair of transistors and connected together in the form of a differential amplifier. The amplifier circuit operates as a noninverting operational amplifier when an input voltage has a positive polarity, and it operates as an inverting operational amplifier when the input voltage has a negative polarity. The amplifier circuit may also include an emitter follower stage for decreasing the source impedance of the driving circuit for the output amplifier transistors, an anti-saturation circuit for clamping the collector potential of the output transistors, and a current limit circuit for establishing a maximum current in the output transistors.

6 Claims, 3 Drawing Figures

LINEAR CLASS B TRANSCONDUCTANCE POWER AMPLIFIER

BACKGROUND OF THE INVENTION

The present invention relates to an improved amplifier circuit, and more specifically, to a linear class B transconductance power amplifier suited for driving an inductive load.

In a variety of applications, a transformer winding or other inductive load must be driven linearly with respect to a dynamic voltage signal to produce a magnetic field that tracks the signal waveform exactly. An example of such a requirement is found in the CRT beam convergence systems of color video monitors and television receivers.

Color CRTs of the type used in most present-day television and similar color image display systems have three electrons guns—one for each of three primary colors (red, green and blue). To reproduce color images correctly, the electron beam from these guns must converge at the tube's phosphor display screen, and must remain in convergence as they are deflected over its surface. This is accomplished by bending the beams individually using a combination of fixed and dynamic magnetic fields. In a typical system, magnetic pole pieces mounted on each gun are actuated by individual electromagnets in an external convergence yoke to control the radial positions of the beams.

The convergence circuitry for such a color display system generates suitable correction signals for each beam in synchronization with the horizontal and vertical deflection signals, and drives individual red, green and blue convergence coils in the convergence yoke to maintain the beams in coincidence at all points on the display screen. A total of four dynamic convergence signals may be generated: red, green, blue and blue lateral. Each of these signals is a combination of several correction signals that affect different areas of the screen. The summed correction signals are converted from voltage to current waveforms and applied to the respective convergence coils by individual linear output amplifiers. In a convergence system for a high resolution color CRT, it is important for the output amplifiers to reproduce the correction waveforms accurately, driving each convergence coil with a current that is a linear representation of the input voltage waveform.

OBJECTS OF THE INVENTION

Accordingly, a primary object of the present invention is to provide an improved amplifier circuit for driving inductive loads, such as the dynamic convergence coils for a multigun color CRT.

Another object of the invention is to provide a linear class B transconductance amplifier adapted for driving inductive loads with minimal waveform distortion.

Still another object of the invention is to provide a CRT convergence system output amplifier that is economical to manufacture using standard components, and at the same time provides improved performance.

Further objects, features and advantages of the present invention will become evident as the following detailed description is read in conjunction with the accompanying drawing.

DETAILED DESCRIPTION

Figure 1:
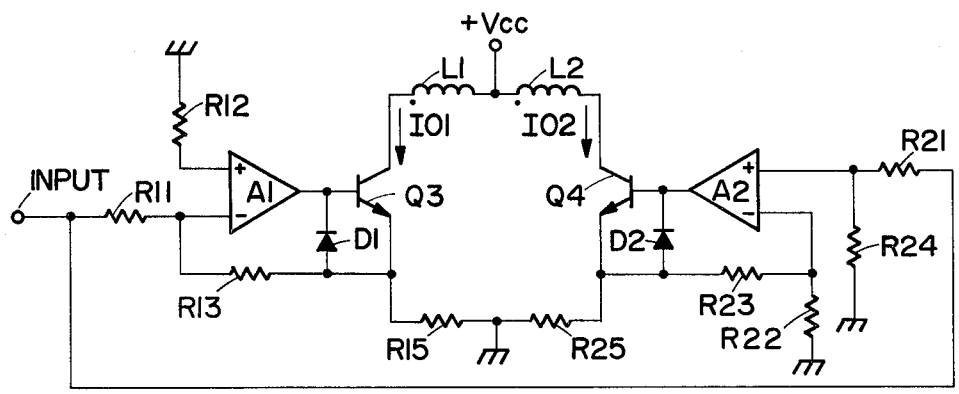
FIG. 1 is a schematic diagram of a first power amplifier circuit comprising a pair of class B amplifiers operating in a push-pull arrrangement.

Referring now to the drawing, an amplifier circuit suitable for driving an inductive load in a linear manner is shown in FIG. 1. The FIG. 1 circuit consists, in essence, of a pair of class B amplifiers connected in a push-pull arrangement and driven by a common input signal. A first one of the class B amplifiers includes an operational amplifier A1 coupled by an input resistor R11 to receive signals $e_{in}$ applied to an INPUT terminal from a suitable voltage source, such as a convergence waveform generator (not shown). The input signals are coupled to the op-amp's inverting input, its non-inverting input being returned to ground through a resistor R12. The output of op-amp A1 is connected to the base electrode of an NPN transistor Q3, the emitter electrode of which is connected to ground through a resistor R15. A feedback resistor R13 is connected from the emitter of Q3 to the inverting input of A1. A diode D1 across the base-emitter junction of the transistor protects it from reverse voltage. The collector of NPN transistor Q3 is connected to a suitable positive voltage source +Vcc by inductor L1.

The second class B amplifier is essentially a mirror image of the first, except that input signals are applied via input resistor R21 to the non-inverting input of op-amp A2, and the inverting input is returned to ground (via resistor R22). Load inductor L2, which is identical in value to inductor L1, is connected between source +Vcc and the collector of NPN transistor Q4. Resistors R23, R25 and diode D2 are the functional counterparts of previously-described resistors R13, R15 and diode D1, respectively.

In operation, the high internal gain of operational amplifiers A1 and A2 makes the FIG. 1 circuit develop a voltage equal to $-(R13/R11) e_{in}$ at the emitter of Q3 and $[R24/(R24+R21)] \cdot [(R22+R23)/R22] e_{in}$ at the emitter of Q4. During positive excursions of the input signal ($e_{in} > 0$), Q4 conducts but Q3 does not. The output current I02 into the collector of Q4 is given by the following expression:

$$I02 = \frac{R22 + R23}{R25 \cdot R22} e_{in} \cdot \frac{R24}{R24 + R21} \quad (1)$$

If R24=R23 and R21=R22, then $$I02 = \frac{R23}{R25 \cdot R22} e_{in} \quad (1a)$$

Similarly, when Q3 conducts (and Q4 does not) during negative excursions of the input signal ($e_{in} < 0$), the output current I01 into the collector of Q3 is given by the expression:

$$IO1 = \frac{R13}{R15 \cdot R11} e_{in} \qquad (2)$$

It will be understood from the foregoing analysis that circuit values must be chosen carefully to assure linear operation over the entire range of both positive and negative excursions of the input signal $e_{in}$. Moreover, op-amps A1 and A2 may not operate identically, resulting in some error in the output current.

Figure 2:
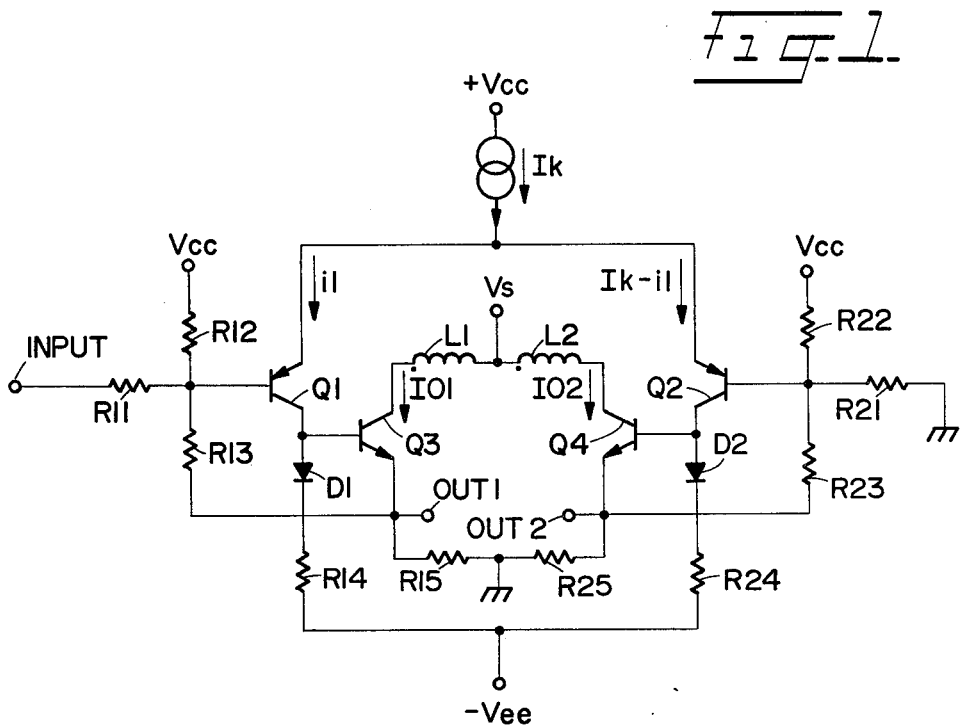
FIG. 2 is a schematic diagram of a second power amplifier circuit according to a preferred embodiment of the present invention.

Many of the drawbacks inherent in the FIG. 1 circuit are absent in the improved linear amplifier circuit shown in FIG. 2. It includes two PNP transistors Q1, Q2 and two NPN transistors Q3, Q4 connected to form an amplifier that switches from inverting to non-inverting amplifier in response to the polarity of the voltage signal applied to its INPUT terminal. The amplifier may be thought of as including two sides: an inverting side made up of transistors Q1 and Q3 that is active on negative cycles, and a non-inverting side made up of transistors Q1, Q2 and Q4 that is active on positive cycles. The two sides operate in a class B, push-pull fashion, alternately pulling current through one half of the inductive load (L1+L2) or the other.

Referring now in greater detail to the FIG. 2, input signals $e_{in}$ are coupled to the base electrode of a first PNP transistor Q1 by an input resistor R11. The base of Q1 also is connected to a voltage source Vcc by a resistor R12, and to the emitter of a first NPN transistor Q3 by a resistor R13. Transistor Q1 is connected as an emitter-coupled pair with similar transistor Q2, the emitters of both PNP transistors being connected to a suitable constant current source Ik. The base of transistor Q2 is connected to source Vcc via a resistor R22, and is returned to ground through a resistor R21. The base of Q2 also is connected to the emitter of a second NPN transistor Q4 by a resistor R23. The values of resistors R11, R12 and R13 are identical with those of resistors R21, R22 and R23, respectively.

The collectors of matched transistors Q1 and Q2 are each connected to a negative source −Vee through a series-connected diode D1 (or D2) and resistor R14 (or R24) as shown. The collectors of Q1 and Q2 also are connected to the base electrodes of transistors Q3 and Q4, respectively. Resistors R15 and R25 connect the respective emitters of transistors Q3 and Q4 to ground reference. Finally, the collectors of NPN transistors Q3 and Q4 are connected to a positive voltage source Vs by inductors L1 and L2, respectively, which together may form the convergence correction coil for one of the electron guns in a color CRT.

As will be understood, transistor pair Q1 and Q2 and current source Ik function as a differential amplifier. When input signal $e_{in}$ is negative, Q4 is turned off and and transistors Q1 and Q3 (and their associated resistors) form a two transistor inverting amplifier to develop an output voltage $e_{out} = -(R13/R11) e_{in}$ at terminal OUT 1 (the emitter of transistor Q3). The output current I01 through inductor L1 is, therefore, given by expression (2) above. No current flows through inductor L2, since Q4 is off during negative excursions of the input signal. When the input signal $e_{in}$ is positive, transistor Q3 is turned off and transistors Q1, Q2 and Q4 form a three transistor non-inverting amplifier.

As the voltage input signal $e_{in}$ increases, the emitter current of Q1 decreases, thereby increasing the emitter current of transistor Q2. The resulting current in the collector of Q2 is amplified by Q4 to provide the output current I02. The voltage gain from the INPUT terminal to terminal OUT 2 is given by the following equation:

$$e_{OUT2} = e_{in}\left[\frac{(R21 \cdot R22) + (R23 \cdot R21) + (R23 \cdot R22)}{R21 \cdot R22}\right] \cdot$$

$$\left[\frac{R13 \cdot R12}{(R11 \cdot R12) + (R13 \cdot R11) + (R13 \cdot R12)}\right]$$

If R11=R21, R12=R22 and R13=R23, the equation reduces to:

$$e_{OUT2} = e_{in}(R13/R11)$$

Figure 3:
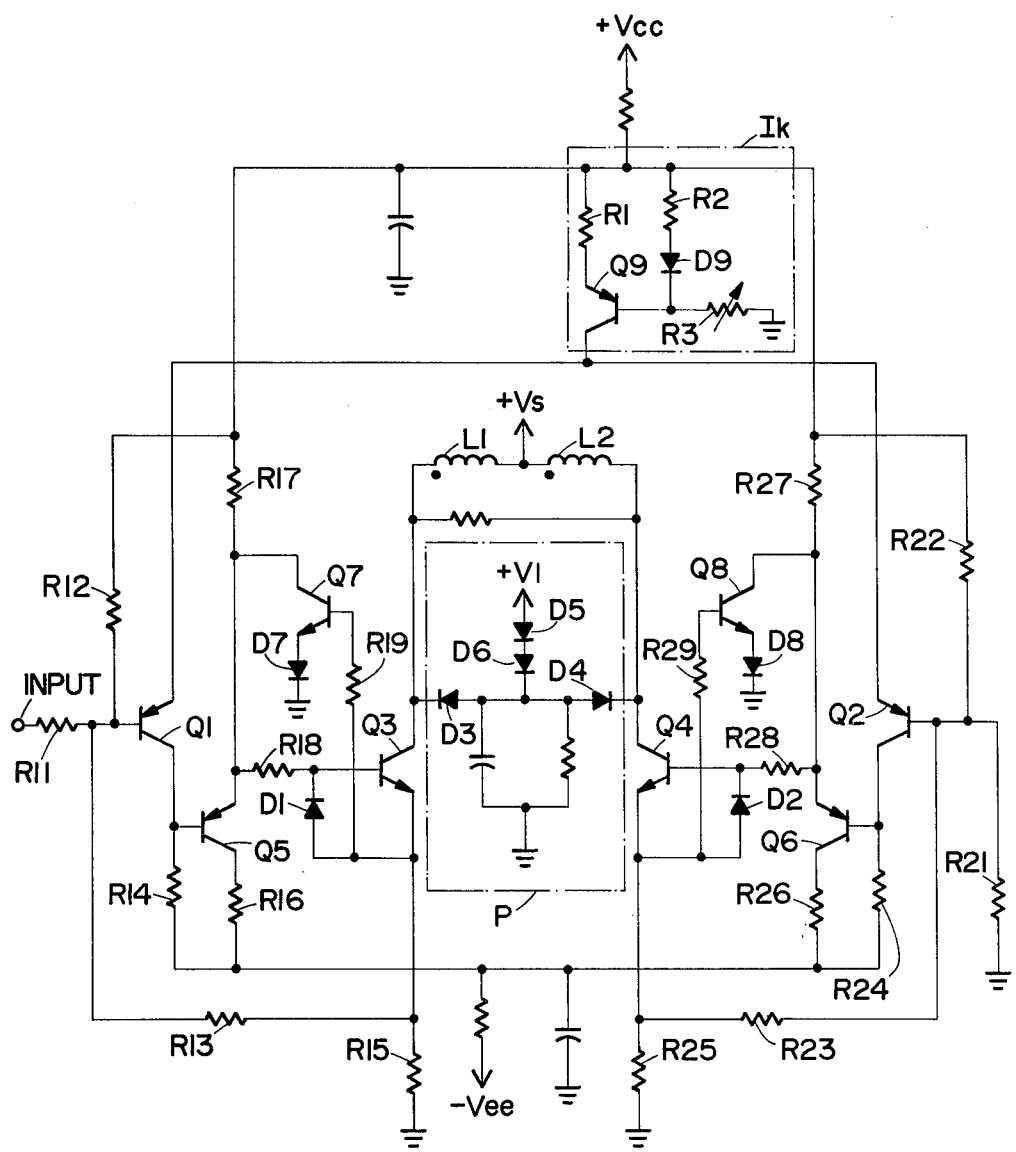
FIG. 3 is a schematic diagram of an improved version of the FIG. 2 circuit, and illustrates the best mode presently contemplated for the practice of the invention.

A linear class B transconductance amplifier according to the best mode presently contemplated is shown in FIG. 3. As will be evident, the FIG. 3 circuit is similar functionally and architecturally to the previously-described FIG. 2 circuit, but includes certain additional features useful in practical applications of the circuit. These include an intermediate emitter-follower current amplifier stage comprising PNP transistors Q5 and Q6, an anti-saturation circuit (P) that includes diodes D3, D4, D5 and D6, and load current limiting circuitry comprising NPN transistors Q7 and Q8.

In a manner analagous to the FIG. 2 circuit, transistors Q1, Q5, Q3, Q2, Q6, Q4 form a differential amplifier with a constant current source Ik connected to the emitters of Q1 and Q2. The two sides of the amplifier—i.e., the inverting side formed by Q1, Q5 and Q3 and their associated components, and the non-inverting side formed by Q1, Q2, Q6 and Q4—function to pull current through load inductors L1 or L2 depending on the polarity of the signal applied to the INPUT terminal. The intermediate, emitter follower stages formed by transistors Q5 and Q6 serve to decrease the source impedance of the signals driving output transistors Q3 and Q4, respectively, thereby improving transient response.

The anti-saturation circuit indicated in dot-dash outline at P limits the collector potential of output transistors Q3 and Q4 to a level determined by reference voltage V1 to prevent Q3 and Q4 from going into saturation. Transistors Q7 and Q8 function to limit the current through load inductors L1 and L2, respectively, by preventing the emitters of output transistors Q3 and Q4 from rising above a set value (about 1.4 volts in the FIG. 3 circuit). When the current in Q3, for example, approaches the predetermined limit value, the voltage across R15, applied to the base of Q7 by resistor R19, will cause Q7 to conduct and reduce the drive to the base of output transistor Q3 to a value determined by the voltage drop across diode D7 plus that across the base-emitter junction of Q7. A similar action occurs to limit the current in Q4 by means of R29, Q8 and D8.

Resistors R15 and R25 sample the current through the outputs of their respective sides of the amplifier, and resistors R13 and R23 feed back the sampled voltage to their respective inputs. The common connection of L1 and L2 is tied to a supply +Vs derived from the Vcc supply. Transistor Q9, resistors R1, R2 and R3, and diode D9 provide a constant current source Ik for the FIG. 3 amplifier. Variable resistor R3 allows the current through Q9 to be adjusted to ensure linearity during the switching interval between the two sides of the amplifier, and thus functions as a crossover distortion adjustment.

The above-described amplifier circuits of FIGS. 2 and 3 provide a number of improvements over known prior art transconductance power amplifiers, including: (a) the use of a differential configuration whereby a single amplifier switches from inverting to non-inverting operation in response to changes in the polarity of the voltage input signal; (b) the use of the same resistors in the feedback circuit for each operating mode, which reduces tolerance problems; and (c) the amplifier does not go into saturation during any part of the cycle.

Although the above description has been directed to certain preferred embodiments of the invention, it will be understood that various modifications and improvements may be made for different specific applications without departing from the scope of the specification's teachings. Amplifiers of the type herein described can be used in many applications wherein an input signal voltage is to be converted to a corresponding output current. Further, such amplifiers are not limited to driving inductive loads. It should also be noted that the novel amplifier circuit of the invention can be used as an absolute amplifier by using a common load for both output transistors (i.e., Q3 and Q4). In such an embodiment, the output current through the common load is proportional to the absolute value of the input signal. Such absolute amplifiers would find use in a wide variety of applications, such as in waveform converter circuits. Such variations are not to be regarded as a departure from the spirit and scope of the invention, and all such modifications as would be obvious to one skilled in the art are intended to be included within the scope of the following claims.

I claim as my invention:

1. An amplifier circuit comprising:
    first and second transistors each having a base, an emitter and a collector, the emitters of the first and second transistors being connected together and to a reference potential level and the collectors of the first and second transistors being connected together and to a first voltage source, the emitter of at least one of the first and second transistors being connected to an output terminal of the amplifier circuit; and
    third and fourth transistors each having a base, an emitter and a collector, said third and fourth transistors being connected together as a differential pair amplifier with the collectors of the third and fourth transistors connected together and to a second voltage source and also connected to the bases of the first and second transistors respectively, the emitters of the third and fourth transistors connected together and to a current source, the base of the third transistor connected to a reference potential level and the base of the fourth transistor connected to an input terminal of the amplifier circuit, whereby said amplifier circuit operates as a non-inverting operational amplifier when an input voltage at said input terminal has one polarity and said amplifier circuit operates as an inverting operational amplifier when said input voltage at said input terminal has a polarity opposite to said one polarity.

2. An amplifier circuit according claim 1, further comprising fifth and sixth transistors each having a base, an emitter and a collector, the bases of the fifth and sixth transistors being connected to the collectors of the third and fourth transistors respectively, the emitters of the fifth and sixth transistors being connected to the bases of the first and second transistors respectively and the collectors of the fifth and sixth transistors being connected to said second voltage source, whereby the collectors of the third and fourth transistors are connected to the bases of the first and second transistors respectively through the fifth and sixth transistors respectively, connected in emitter-follower configuration.

3. An amplifier circuit in accordance with claim 2, further comprising current limiting circuit means connected between the emitters of the fifth and sixth transistors and the bases of the first and second transistors respectively for limiting the current in the first and second transistors to a maximum predetermined level.

4. An amplifier circuit in accordance with claim 1, further comprising anti-saturation circuit means connected to the collectors of the first and second transistors for clamping the voltage potential at the collectors of the first and second transistors to a predetermined voltage level.

5. An amplifier circuit in accordance with claim 1, wherein the collector of at least one of the first and second transistors is connected to the first voltage source through an inductive load.

6. An amplifier circuit in accordance with claim 1, wherein the collectors of the first and second transistors are connected to the first voltage source through first and second inductive loads respectively.

* * * * *